United States Patent [19]

Murotani

[11] 4,296,339
[45] Oct. 20, 1981

[54] LOGIC CIRCUIT COMPRISING CIRCUITS FOR PRODUCING A FASTER AND A SLOWER INVERTED SIGNAL

[75] Inventor: Tatsunori Murotani, Tokyo, Japan

[73] Assignee: Nippon Electric Co., Ltd., Tokyo, Japan

[21] Appl. No.: 973,776

[22] Filed: Dec. 27, 1978

[30] Foreign Application Priority Data

Dec. 27, 1977 [JP] Japan .................. 52-158839

[51] Int. Cl.³ .............. H03K 19/094; H03K 19/003; H03K 19/20
[52] U.S. Cl. .................. 307/450; 307/475
[58] Field of Search ......... 307/205, 270, 264, DIG. 1, 307/DIG. 5; 365/189, 230

[56] References Cited

U.S. PATENT DOCUMENTS

| | | | |
|---|---|---|---|
| 3,851,189 | 11/1974 | Moyer | 307/360 X |
| 3,938,108 | 2/1976 | Salsbury et al. | 307/DIG. 1 X |
| 3,946,369 | 3/1976 | Pashley | 307/270 X |
| 3,969,633 | 7/1976 | Paluck et al. | 307/205 |
| 4,077,031 | 2/1978 | Kitagawa et al. | 307/DIG. 1 X |
| 4,087,704 | 5/1978 | Mehta et al. | 307/DIG. 1 X |
| 4,110,842 | 8/1978 | Sarkissian et al. | 307/DIG. 5 X |
| 4,129,793 | 12/1978 | Bula et al. | 307/DIG. 1 X |
| 4,161,040 | 7/1979 | Satoh | 307/DIG. 1 X |

OTHER PUBLICATIONS

Hsu, "True, Push-Pull Driver;" *IBM Tech. Discl. Bull.;* vol. 19, No. 3, pp. 998-999; 8/1976.

*Primary Examiner*—Larry N. Anagnos
*Attorney, Agent, or Firm*—Sughrue, Mion, Zinn, Macpeak and Seas

[57] ABSTRACT

A logic circuit comprises a first and a second inverter for producing a first and a second inverted signal, respectively, one of which varies faster with a common variable input signal than the other. Responsive to the first inverted signal, a first buffer circuit produces a first output signal having a phase opposite to the input signal. Supplied with the second inverted signal, a second buffer circuit produces a second output signal having a phase same as the input signal. Preferably, the first buffer circuit comprises a depletion field effect transistor controlled by the first inverted signal and an enhancement field effect transistor controlled by the input signal. The second buffer circuit comprises an enhancement field effect transistor controlled by the second inverted signal and a depletion field effect transistor controlled by the input signal. More preferably, each of the first and the second inverters comprises a driving and a load field effect transistor. Amplification characteristics are rendered different from each other between the driving transistors of the first and the second inverters and/or between the load transistors of the respective inverters so as to make the first inverted signal have a level higher than the second inverted signal within an interval of time during the variation of the input signal.

9 Claims, 4 Drawing Figures

LOGIC CIRCUIT COMPRISING CIRCUITS FOR PRODUCING A FASTER AND A SLOWER INVERTED SIGNAL

BACKGROUND OF THE INVENTION

This invention relates to a logic circuit and, more particularly, to a logic circuit that may be used as an address inverter.

An address inverter is for producing, in response to an address signal variable between a low and a high level, such as a logic "1" and a logic "0" level, a first and a second output signal that vary with phases opposite to and same as the address signal, respectively. The address inverters are used in combination with a plurality of decoders, each connected to the address inverters, in an I.C. memory in order to decode various address signals from time to time. As will later be described in detail with reference to a few figures of the accompanying drawing, a conventional address inverter produces the output signals with levels thereof rendered lower than a predetermined level during an interval of time in which the address signal varies from a first level to a second between the low and the high levels. Such output signals will make the decoders having a threshold level equal to the predetermined level erroneously decode each address signal into two or more decoder output signals.

SUMMARY OF THE INVENTION

It is therefore a general object of the present invention to provide a logic circuit capable of producing, in response to an input signal of a certain phase, an inphase and an opposite-phase output signal having levels that are never rendered lower than a predetermined level at a time.

It is a specific object of this invention to provide a logic circuit that may be used together with similar logic circuits and a plurality of decoders in correctly producing a decoder output signal at a time in response to an input address signal.

According to this invention, there is provided a logic circuit responsive to a variable input signal for producing a first and a second output signal that vary with phases opposite to and same as the input signal, respectively. The logic circuit comprises a first and a second inverter circuit responsive to the input signal for producing a first and a second inverted signal, respectively. One of the first and the second inverted signals should vary with the input signal faster than the other of the first and the second inverted signals. The logic circuit further comprises a first and a second buffer circuit, first means for supplying the first inverted signal to the first buffer circuit, and second means for supplying the second inverted signal to the second buffer circuit, whereby the first and the second buffer circuits produce the first and the second output signals, respectively.

DESCRIPTION OF THE PREFERRED EMBODIMENTS

Figure 1:
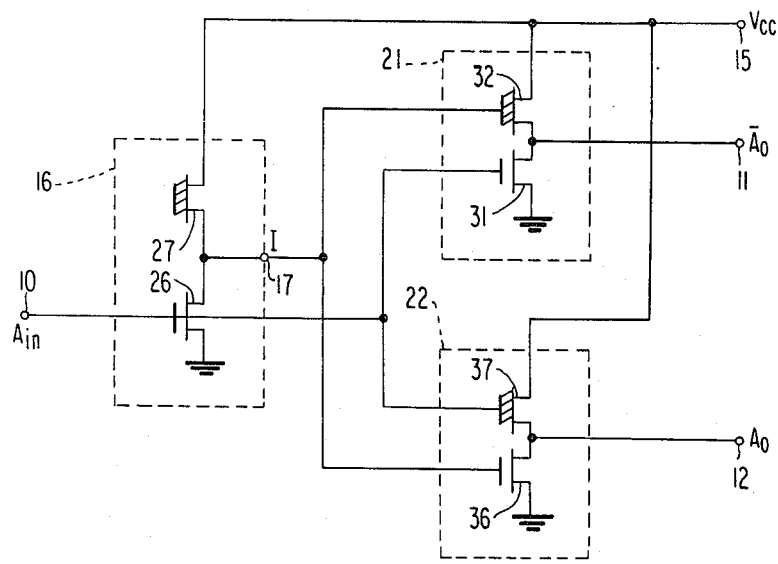
FIG. 1 illustrates the circuit of a conventional address inverter.
Figure 2:
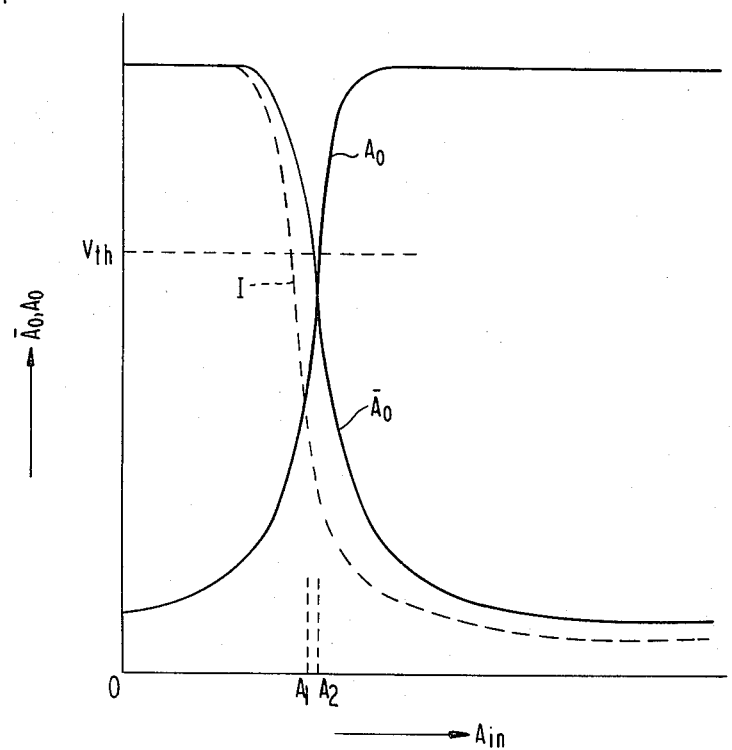
FIG. 2 shows d.c. transfer characteristics of the address inverter depicted in FIG. 1.

Referring to FIGS. 1 and 2, a conventional address inverter will be described at first for a better understanding of the present invention. The address inverter comprises a circuit input terminal 10 for an input address signal $A_{in}$ variable with a certain phase between a low and a high level along the abscissa depicted in FIG. 2, a first circuit output terminal 11 for a first or opposite-phase output signal $\overline{A}_o$ variable with a phase opposite to the input signal $A_{in}$, a second circuit output terminal 12 for a second or inphase output signal $A_o$ variable with a phase same as the input signal $A_{in}$, and a power supply terminal 15 for a power supply voltage $V_{cc}$. Responsive to the input signal $A_{in}$, an inverter circuit 16 supplies an inverter output terminal 17 thereof with an inverted signal I. Supplied with the inverted signal I, a first buffer circuit 21 delivers the first output signal $A_o$ to the first output terminal 11. Responsive to the inverted signal I, a second buffer circuit 22 supplies the second output signal $A_o$ to the second output terminal 12. Each of the inverter circuit 16 and the buffer circuits 21 and 22 is supplied with the power supply voltage $V_{cc}$.

Referring to FIG. 1 more in detail, each of the inverter circuit 16 and the first and the second buffer circuits 21 and 22 comprises field effect transistors known as FET's. Merely for simplicity of description, it is presumed in the following that the field effect transistors are n-channel MIS field effect transistors. The inverter circuit 16 comprises a field effect transistor of the enhancement type 26 having a gate electrode connected to the circuit input terminal 10, a source electrode grounded, and a drain electrode connected to the inverter output terminal 17. The inverter circuit 16 further comprises a field effect transistor of the depletion type 27 having a gate and a source electrode connected to the drain electrode of the enhancement-type field effect transistor 26 and a drain electrode connected to the power supply terminal 15. The first buffer circuit 21 comprises a field effect transistor of the enhancement type 31 having a gate electrode connected to the circuit input terminal 10, a source electrode grounded, and a drain electrode connected to the first circuit output terminal 11. In the first buffer circuit 21, a field effect transistor of the depletion type 32 has a gate electrode connected to the inverter output terminal 17, a source electrode connected to the drain electrode of the depletion-type field effect transistor 31, and a drain electrode connected to the power supply terminal 15. The second buffer circuit 22 comprises field effect transistors of the enhancement and the depletion types 36 and 37 connected in a manner similar to the field effect transistors 31 and 32 except that the gate electrodes of the enhancement-type and the depletion-type field effect transistors 36 and 37 are connected to the inverter output terminal 17 and the circuit input terminal 10, respectively. The field effect transistors 31 and 32 of the first buffer circuit 21 are thus driven by opposite-phase signals $A_{in}$ and I to supply the first output terminal 11 with the opposite-phase output signal $\overline{A}_o$. The field effect transistors 36 and 37 of the second buffer circuit 22 are also supplied with the opposite-phase signals $A_{in}$ and I to deliver the inphase output signal $A_o$ to the second output terminal 12. It is to be noted here that the inverted signal I is supplied to the depletion-type field effect transistor 31 in the first buffer circuit 21 and to the enhancement-type field effect transistor 37 in the second buffer circuit 22.

Referring more specifically to FIG. 2, the opposite-phase and the inphase output signals $\overline{A}_o$ and $A_o$ of the conventional address inverter vary with the input address signal $A_{in}$ as exemplified therein. The manner in which the inverted signal I varies is depicted also in FIG. 2. The complementary output signals $A_o$ and $\overline{A}_o$ have levels lower than a predetermined level $V_{th}$ when the input signal $A_{in}$ varies from a first level $A_1$ to a second level $A_2$ or vice versa between the low and the high levels. NOR-type decoders (not shown) having a logic threshold level equal to the predetermined level $V_{th}$ for decoding the opposite-phase and the inphase output signals, such as $\overline{A}_o$ and $A_o$, of the address inverters of the conventional type therefore erroneously decode each input address signal into two or more decoder output signals during variation of that input signal beyond the first and the second levels $A_1$ and $A_2$ between the low and the high levels.

Figure 3:
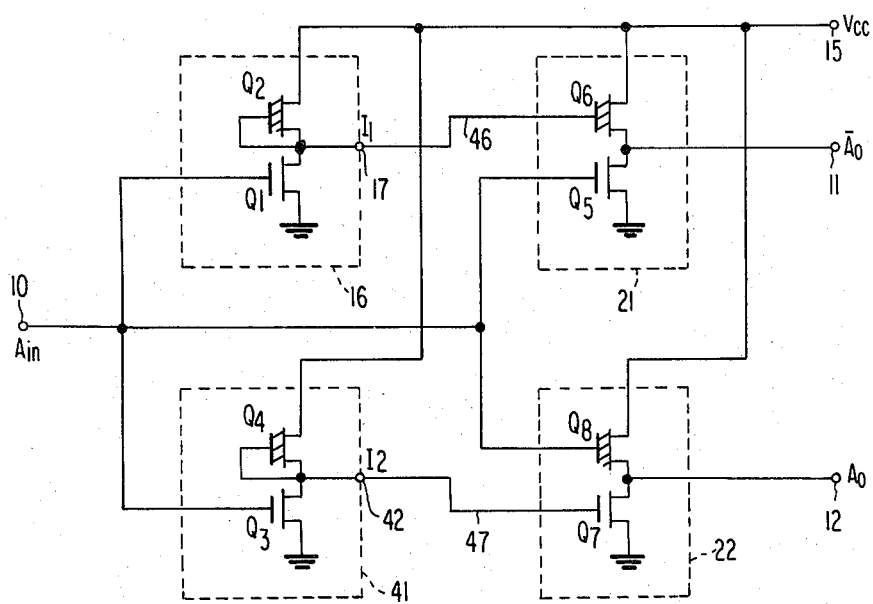
FIG. 3 shows the circuit of an address inverter according to a preferred embodiment of the instant invention.

Turning now to FIG. 3, an address inverter according to a preferred embodiment of this invention comprises similar parts designated by like reference numerals. In addition to the inverter circuit 16 for supplying the inverter output terminal 17 with the inverted signal I that is now designated by $I_1$, the address inverter comprises a second inverter circuit 41 responsive to the input address signal $A_{in}$ for delivering a second inverted signal $I_2$ to a second inverter output terminal 42. The first buffer circuit 21 is supplied with the first inverted signal $I_1$ through a first connection 46 to produce the opposite-phase output signal $\overline{A}_o$ and the second buffer circuit 22, with the second inverted signal $I_2$ through a second connection 47 to produce the inphase output signal $A_o$. As will be described later, the first and the second output signals $\overline{A}_o$ and $A_o$ never take a level lower than a predetermined level $V_{th}$ at a time if one of the first and the second inverted signals $I_1$ and $I_2$ is made to vary faster than the other with the input signal $A_{in}$. When the decoders to be connected to such address inverters are of the negative logic, such as of the NOR type, to produce a decoder output signal that varies from the low level to the high level when the decoder input signal varies from the high level to the low level, at least the variation from the high level to the low level in the second inverted signal $I_2$ should be rendered faster than the variation that simultaneously occurs in the first inverted signal $I_1$. When the decoders are of the positive logic, such as of the AND type, to produce a decoder output signal that varies from the low level to the high level in response to a variation from the low level to the high level in the decoder input signal, at least the variation from the low level to the high level in the first inverted signal $I_1$ should be quicker than the simultaneous variation in the second inverted signal $I_2$.

Referring more particularly to FIG. 3, the first inverter circuit 16 comprises a first field effect transistor $Q_1$ of the enhancement type and a second field effect transistor $Q_2$ of the depletion type. The first and the second transistors $Q_1$ and $Q_2$ correspond to the field effect transistors 26 and 27, respectively. The second inverter circuit 41 is of a like structure and comprises third and fourth field effect transistors $Q_3$ and $Q_4$ of the enhancement and the depletion types, respectively. The first buffer circuit 21 comprises fifth and sixth field effect transistors $Q_5$ and $Q_6$ that are of the enhancement and the depletion types and correspond to the field effect transistors 31 and 32, respectively. The second buffer circuit 22 similarly comprises seventh and eighth field effect transistors $Q_7$ and $Q_8$ corresponding to the field effect transistors 36 and 37, respectively. The inverter circuits 16 and 41 may be of any other type provided that the first and the second inverter circuits 16 and 41 are capable of producing, in response to an input address signal $A_{in}$, first and second inverted signals $I_1$ and $I_2$, respectively, one of which varies faster with the input signal $A_{in}$ than the other. When each of the inverter circuits 16 and 41 comprises a driving transistor $Q_1$ or $Q_3$ and a load transistor $Q_2$ or $Q_4$, it is possible to make the speeds of variation of the respective inverted signals $I_1$ and $I_2$ have the above-mentioned difference by giving a difference between the amplification characteristics of the driving transistors $Q_1$ and $Q_3$ of the first and the second inverter circuits 16 and 41 or between those of the load transistors $Q_2$ and $Q_4$ of the respective inverter circuits 16 and 41. It is also possible to provide the above-described difference in the speeds by giving differences both between the amplification characteristics of the driving transistors $Q_1$ and $Q_3$ of the respective inverter circuits 16 and 41 and between those of the load transistors $Q_2$ and $Q_4$ of the inverter circuits 16 and 41.

Figure 4:
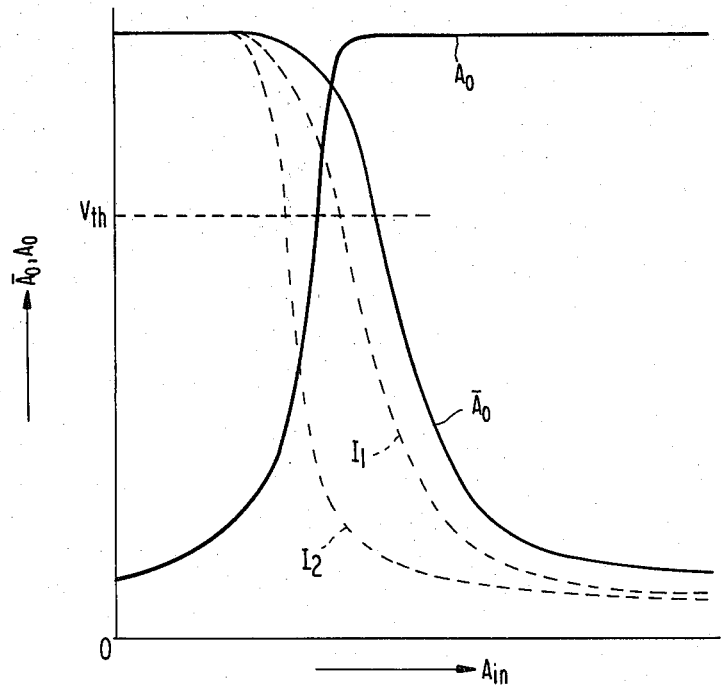
FIG. 4 shows d.c. transfer characteristics of the address inverter illustrated in FIG. 3.

Referring again to FIG. 3 and afresh to FIG. 4, let it be surmised that the amplification characteristics of the first through the fourth transistors $Q_1$ through $Q_4$ of the first and the second inverter circuits 16 and 41 are given by:

$$\beta(Q_2)/\beta(Q_4) > \beta(Q_1)/\beta(Q_3),$$

where $\beta(Q_i)$ represents the ratio $I_{ds}/V_g$ of the source-drain current $I_{ds}$ of the i-th transistor $Q_i$ ($i=1, 2, 3,$ or 4) to the gate voltage $V_g$ thereof. When the input address signal $A_{in}$ varies from the logic "1" level to the logic "0" level, the first inverted signal $I_1$ is given a higher level than the second inverted signal $I_2$. In other words, the second inverted signal $I_2$ varies faster than the first inverted signal $I_1$. Inasmuch as the depletion-type field effect transistor $Q_6$ of the first buffer circuit 21 is controlled by a signal having a higher level than the signal that drives the enhancement-type field effect transistor $Q_7$ of the second buffer circuit 22, the opposite-phase output signal $\overline{A}_o$ delivered by the first buffer circuit 21 to the first circuit output terminal 11 takes the high level in a wider range during variation of the input signal $A_{in}$ than the opposite-phase output signal $\overline{A}_o$ of the conventional address inverter in which the transistors 32 and 36 corresponding to the transistors $Q_6$ and $Q_7$, respectively, are controlled in common by the same inverted signal I. It is therefore possible with the address inverter illustrated with reference to FIG. 3 to prevent the first and the second output signals $\overline{A}_o$ and $A_o$ from simultaneously having levels lower than a predetermined level $V_{th}$. This makes it possible to avoid erroneous decoding of the input address signal $A_{in}$ when the address inverter is used in decoding the input signal $A_{in}$ in combination with decoders having a logic threshold level equal to the predetermined level $V_{th}$.

While this invention has thus far been described in conjunction with an address inverter, it is now obvious that this invention is applicable generally to a logic circuit for producing a pair of logic signals in response to an input signal variable between a low and a high level. Furthermore, the above description will enable those skilled in the art to readily design a logic circuit comprising p-channel field effect transistors. It is also clear that the buffer circuits may be of any other design.

What is claimed is:

1. A logic circuit responsive to a variable input signal for producing a first and a second output signal that vary with phases opposite to and same as said input signal, respectively, said circuit comprising:
    a first and a second inverter circuit responsive to said input signal for producing a first and a second inverted signal, respectively, one of said first and said second inverted signals varying with said input signal faster than the other of said first and said second inverted signals;
    a first and a second buffer circuit;
    first means for supplying said first inverted signal to said first buffer circuit; and
    second means for supplying said second inverted signal to said second buffer circuit; and
    third means for supplying said input signal to both of said first and said second buffer circuits;
    whereby said first and said second buffer circuits produce said first and said second output signals, respectively.

2. A logic circuit as claimed in claim 1, wherein:
    said first buffer circuit comprises a field effect transistor of the depletion type having a gate electrode connected to said first means and a field effect transistor of the enhancement type having a gate electrode connected to said third means;
    said second buffer circuit comprising a field effect transistor of the enhancement type having a gate electrode connected to said second means and a field effect transistor of the depletion type having a gate electrode connected to said third means;
    said first inverted signal having a level higher than said second inverted signal within an interval of time during the variation of said input signal.

3. A logic circuit as claimed in claim 2, wherein:
    said first inverter circuit comprises a driving field effect transistor and a load field effect transistor, said driving transistor having a gate electrode supplied with said input signal and a drain electrode connected to said first means, said load transistor having a gate and a source electrode connected to said first means;
    said second inverter circuit comprising a driving field effect transistor and a load field effect transistor, the driving transistor of said second inverter circuit having a gate electrode supplied with said input signal and a drain electrode connected to said second means, the load transistor of said second inverter circuit having a gate and a source electrode connected to said second means.

4. A logic circuit as claimed in claim 3, wherein the driving transistors of said first and said second inverter circuits have amplification characteristics different from each other.

5. A logic circuit as claimed in claim 3, wherein the load transistors of said first and said second inverter circuits have amplification characteristics different from each other.

6. A logic circuit as claimed in claim 3, wherein the driving transistors of said first and said second inverter circuits have amplification characteristics different from each other, the load transistors of said first and said second inverter circuits having amplification characteristics different from each other.

7. A logic circuit as claimed in claim 4, 5, or 6, wherein the respective amplification characteristics $\beta(Q_1)$, $\beta(Q_2)$ $\beta(Q_3)$, and $\beta(Q_4)$ of the driving and the load transistors of said first inverter circuit and the driving and the load transistors of said second inverter circuit satisfy:

$$\beta(Q_2)/\beta(Q_4) > \beta(Q_1)/\beta(Q_3),$$

where the amplification characteristic $\beta(Q_i)$ of each of the driving and the load transistors $Q_i$ of said first and said second inverter circuits is given by the ratio $I_{ds}/V_g$ of the source-drain current $I_{ds}$ of said each transistor $Q_i$ to the gate voltage $V_g$ of said each transistor $Q_i$.

8. A logic circuit responsive to an input signal for producing a first output signal and a second output signal opposite to said first output signal in phase, said circuit comprising an input terminal for receiving said input signal, first and second nodes, a first and second output terminals, a first field effect transistor having a gate electrode coupled to said input terminal, a drain electrode coupled to said first node and a source electrode supplied with a first potential, a second field effect transistor having a source electrode coupled to said first node and a drain electrode supplied with a second potential, a third field effect transistor having a gate electrode coupled to said input terminal, a drain electrode coupled to said second node and a source electrode supplied with said first potential, a fourth field effect transistor having a source electrode coupled to said second node and a drain electrode supplied with said second potential, a fifth field effect transistor having a gate electrode coupled to said input terminal, a source electrode supplied with said first potential and a drain electrode coupled to said first output terminal, a sixth field effect transistor having a gate electrode coupled to said first node, a source electrode coupled to said first output terminal and a drain electrode supplied with said second potential, a seventh field effect transistor having a gate electrode coupled to said second node, a source electrode supplied with said first potential and a drain electrode coupled to said second output terminal and an eighth field effect transistor having a gate electrode coupled to said input terminal, a source electrode coupled to said second output terminal and a drain electrode supplied with said second potential, in which the respective amplification characteristics $\beta(Q_1)$, $\beta(Q_2)$, $\beta(Q_3)$ and $\beta(Q_4)$ of said first, second, third and fourth field effect transistors satisfy:

$$\beta(Q_2)/\beta(Q_4) > \beta(Q_1)/\beta(Q_3)$$

where the amplification characteristics $\beta(Q_i)$ of each transistor $Q_i$ is given by the ratio $Ids/Vg$ of the source-drain current $Ids$ of said transistor $Q_i$ to the gate voltage $V_g$ of said each transistor $Q_i$.

9. The claim according to claim 8, in which said second, fourth, sixth and eighth transistors are of depletion type and the gate electrodes of said second and fourth transistor are coupled to said first and second nodes respectively.

* * * * *

UNITED STATES PATENT AND TRADEMARK OFFICE
CERTIFICATE OF CORRECTION

PATENT NO. : 4,296,339

DATED : October 20, 1981

INVENTOR(S) : Tatsunori MUROTANI

It is certified that error appears in the above—identified patent and that said Letters Patent is hereby corrected as shown below:

Column 2, line 21, delete "$A_o$" and insert -- $\bar{A}_o$ --

Column 3, line 9, delete "$A_o$" (first occurrence) and insert -- $\bar{A}_o$ --

Signed and Sealed this

Twelfth Day of January 1982

[SEAL]

Attest:

GERALD J. MOSSINGHOFF

Attesting Officer     Commissioner of Patents and Trademarks